(12) United States Patent
Yang

(10) Patent No.: US 8,647,895 B1
(45) Date of Patent: Feb. 11, 2014

(54) PROCESS OF MANUFACTURING CRYSTALLINE SILICON SOLAR CELL

(75) Inventor: Tsun-Neng Yang, Taipei (TW)

(73) Assignee: Institute of Nuclear Energy Research, Atomic Energy Council, Lungtan, Taoyuan (TW)

( * ) Notice: Subject to any disclaimer, the term of this patent is extended or adjusted under 35 U.S.C. 154(b) by 3 days.

(21) Appl. No.: 13/567,361

(22) Filed: Aug. 6, 2012

(51) Int. Cl.
*H01L 21/00* (2006.01)
*H01L 31/0264* (2006.01)

(52) U.S. Cl.
USPC .............................................. 438/19; 136/261

(58) Field of Classification Search
USPC ............................................. 438/19; 136/261
See application file for complete search history.

(56) References Cited

U.S. PATENT DOCUMENTS

2013/0112275 A1\* 5/2013 Hekmatshoar-Tabari et al. ............................. 136/261

\* cited by examiner

*Primary Examiner* — William D Coleman
(74) *Attorney, Agent, or Firm* — Jackson IPG PLLC

(57) ABSTRACT

A process of manufacturing a crystalline silicon solar cell includes forming a rough surface on a surface of the crystalline silicon wafer and an $Al_2O_3$ film is coated on a non-rough surface thereof. A single-sided n diffusion layer and phosphosilicate glass film are formed. An anti-reflection layer SiNx film is formed on a top surface of the phosphosilicate glass film. An Al metallic film is formed as a back ohmic electrode on the $Al_2O_3$ film. The local area of the anti-reflection layer SiNx film and the phosphosilicate glass film is melted and removed to form a local area of n+-Si layer. Then, an Al—Si back ohmic contact electrode is formed between the Al metallic film and the crystalline silicon wafer. A front ohmic contact electrode is formed on the molten and removed area of the antireflection layer SiNx film and the phosphosilicate film by light-induced plating.

7 Claims, 9 Drawing Sheets

PROCESS OF MANUFACTURING CRYSTALLINE SILICON SOLAR CELL

BACKGROUND OF THE INVENTION

1. Field of the Invention

The present invention relates to a process of manufacturing a crystalline silicon solar cell, and more particularly, to a process which not only offers the simplified chemical process with minimal problems about dealing with follow-up chemical solutions, but also achieves the improvement on the photoelectric conversion efficiency of the crystalline silicon solar cell, without adding any extra processing steps to the existing standard process of manufacturing the crystalline silicon solar cell.

2. Description of Related Art

The sun is the source of all energy on Earth. Most of currently known energies such as oil, coal, natural gas, water power, solar energy, wind power, photosynthesis energy, and ocean energy are directly or indirectly from the sun. The energy (~$5 \times 10^{20}$ J) generated by irradiating the sunlight over the entire Earth's surface for one hour is enough for the whole human being to use about 1 year. It is estimated the sun continues emitting sunlight at least five billion years or more, so that the solar energy is regarded as unexhausted, free clean energy.

After the Industrial Revolution, the rapid growth of the global population, the development of the civilization, the improvement of relative technology, and demand for high living quality result in increasingly high demand for and dependence on the energy. Large-scale use of fossil fuels leads to significant decrease in global storage capacity and rise in prices. Large amount of pollutant emission causes global warming and climate anomalies, and other issues about posing threats to human living environment as well. Soaring in the prices of fossil fuels including oil and gas has drawn attention to the global emphasis on alternative energy. It greatly effluences the countries such as Taiwan which heavily relies on imported energy, up to 98% of what is needed. The average $CO_2$ emission for traditional energy generation is about 530 t/GWh. Even though the solar energy is comparatively environmentally friendly, it still generates $CO_2$ emission of 5 t/GWh.

The currently standard process of manufacturing a crystalline silicon solar cell includes the following nine steps:
(1) wafer inspecting, surface defect etching, and cleaning;
(2) textured;
(3) phosphorus diffusing;
(4) phosphosilicate glass etching;
(5) laser isolation;
(6) anti-reflection film coating;
(7) screen printing (silver and aluminum glum);
(8) connector sintering;
(9) solar cell testing and detecting.

Among the above steps, step (1), (2), (3) and (4) are wet-chemical processes which need to use organic acidic and alkali chemicals such as hydrochloric acid (HCl), nitric acid ($HNO_3$), hydrofluoric acid (HF) and isopropyl alcohol (IPA). Those chemicals produce large amount of organic acidic and alkali gas and liquid waste, resulting in the burden on the environment. Therefore, the currently available solar cells cannot be regarded as green products.

The inventors have made long-term efforts in solving such a problem, and successfully got an approach to achieve a process of manufacturing a crystalline silicon solar cell, which can overcome the problem encountered in the prior art.

SUMMARY OF THE INVENTION

A main purpose of this invention is to provide a process of manufacturing a crystalline silicon solar cell, which not only offers the simplified chemical process with minimal problems about dealing with follow-up chemical solutions, but also achieves the improvement on the photoelectric conversion efficiency of the crystalline silicon solar cell, without adding any extra processing steps to the existing standard process of manufacturing the crystalline silicon solar cell.

In order to achieve the above and other objectives, the process of manufacturing a crystalline silicon solar cell according to the invention includes at least the following steps:

Step 1: taking a crystalline silicon wafer, in which a wet-chemical process is used to remove any mechanical damages on a surface of the crystalline silicon wafer, and then the wafer is subject to clean;

Step 2: forming a rough surface on the surface of the crystalline silicon wafer by using a plasma device;

Step 3: coating an $Al_2O_3$ film on a non-rough surface of the crystalline silicon wafer, and then placing the wafer into a high-temperature phosphorus diffusion furnace for phosphorus diffusion.

Step 4: forming a single-sided n diffusion layer on the rough surface of the crystalline silicon wafer by using the phosphorus diffusion process; and forming a phosphosilicate glass (PSG) film on a top surface of the single-sided n diffusion layer;

Step 5: coating an anti-reflection layer SiNx film directly on a top surface of the PSG film;

Step 6: coating an Al metallic film as a back ohmic electrode on one side of the $Al_2O_3$ film;

Step 7: irradiating a laser beam directly onto the anti-reflection layer SiNx film and the PSG film for the melting and removal of a local area, diffusing phosphorus atoms of the PSG film into the n diffusion layer to form a local area of n+—Si layer, and then directly irradiating the $Al_2O_3$ film and the Al metallic film with a laser beam for local area melting and removal so that an Al—Si back ohmic contact electrode is formed between the Al metallic film and the crystalline silicon wafer;

Step 8: forming a Ni film on the molten and removed area of the antireflection layer SiNx film and the PSG film by light-induced plating, and then electroplating a front ohmic contact electrode of copper material on the Ni film to form a solar cell component; and Step 9: form spacers, as peripheral electrical isolation, on the anti-reflection layer SiNx film, the PSG film, the n diffusion layer and the crystalline silicon wafer of the solar cell component by irradiating the laser beam.

In one embodiment of the invention, the crystalline silicon wafer is a p-type or n-type crystalline silicon wafer.

In one embodiment of the invention, the solar cell component includes, from top to bottom, the anti-reflection layer SiNx film, the PSG film, the n diffusion layer, the crystalline silicon wafer, the $Al_2O_3$ film and the back ohmic contact electrode. The front ohmic electrode is located between the anti-reflection layer SiNx film and the PSG film.

In one embodiment of the invention, at Step 7, according to computerized patterns, the laser beam is directly irradiated on the anti-reflection layer SiNx film and the PSG film for melting the local area, while diffusing phosphorus atoms of the PSG film into the n diffusion layer to form a local area of n+—Si layer, and then eradicating the local area of the anti-reflection layer SiNx film and the PSG film by using the laser, completely retaining the area where is not exposed to the laser beam.

In one embodiment of the invention, at Step 7, according to the computerized patterns, the laser beam is irradiated on the Al₂O₃ film and the Al metallic film for local area melting and removal so that an Al—Si back ohmic contact electrode is formed with the irradiated area of the Al₂O₃ film being eradicated by the laser beam while the non-irradiated area being completely retained.

In one embodiment of the invention, the laser beam used at Step 7 and Step 9 is ultraviolet laser, green laser, or infrared light laser.

In one embodiment of the invention, at Step 8, according to the computerized patterns, a mask pattern is formed between the local area of the anti-reflection layer SiNx film and the PSG film and the non-irradiated area of the antireflection layer SiNx film and the PSG film.

DETAILED DESCRIPTION OF THE PREFERRED EMBODIMENTS

The aforementioned illustrations and following detailed descriptions are exemplary for the purpose of further explaining the scope of the present invention. Other objectives and advantages related to the present invention will be illustrated in the subsequent descriptions and appended tables.

Figure 1:
FIG. 1 is a schematic view of Step 1 of a process of manufacturing a crystalline silicon solar cell according to the invention.
Figure 2:
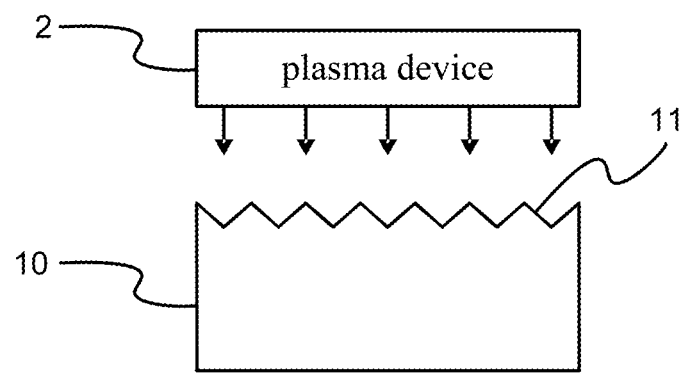
FIG. 2 is a schematic view of Step 2 of a process of manufacturing a crystalline silicon solar cell according to the invention.
Figure 3:
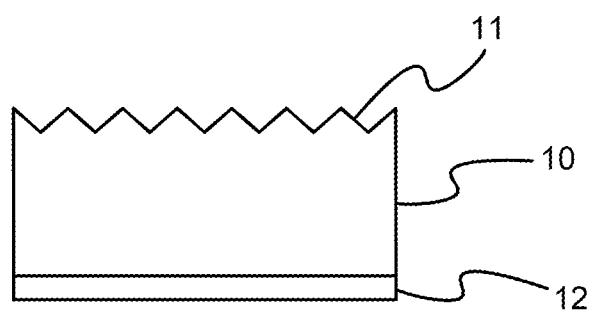
FIG. 3 is a schematic view of Step 3 of a process of manufacturing a crystalline silicon solar cell according to the invention.
Figure 4:
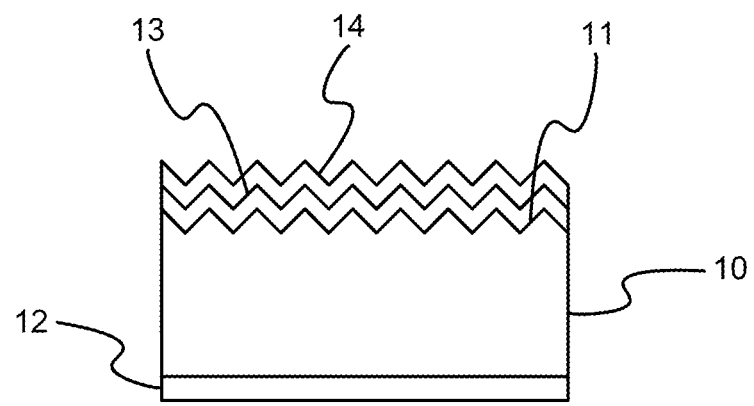
FIG. 4 is a schematic view of Step 4 of a process of manufacturing a crystalline silicon solar cell according to the invention.
Figure 5:
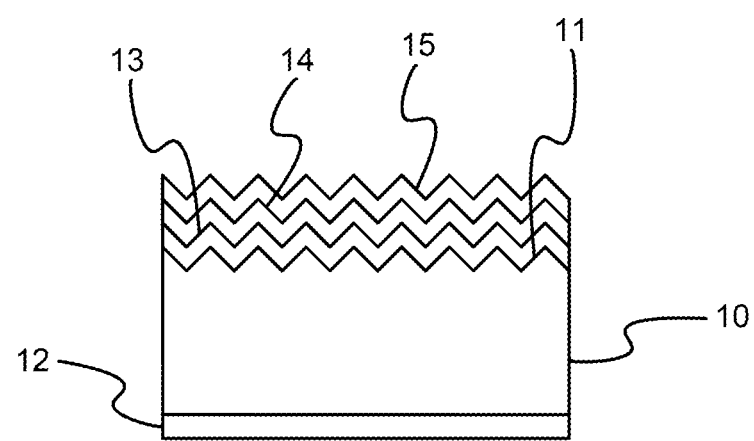
FIG. 5 is a schematic view of Step 5 of a process of manufacturing a crystalline silicon solar cell according to the invention.
Figure 6:
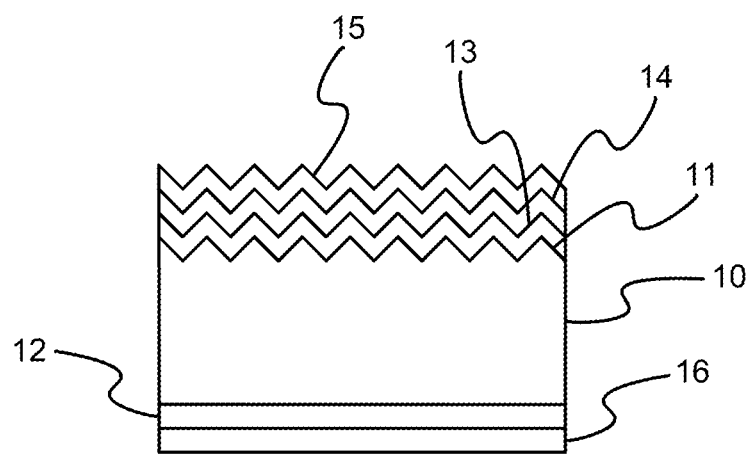
FIG. 6 is a schematic view of Step 6 of a process of manufacturing a crystalline silicon solar cell according to the invention.
Figure 7:
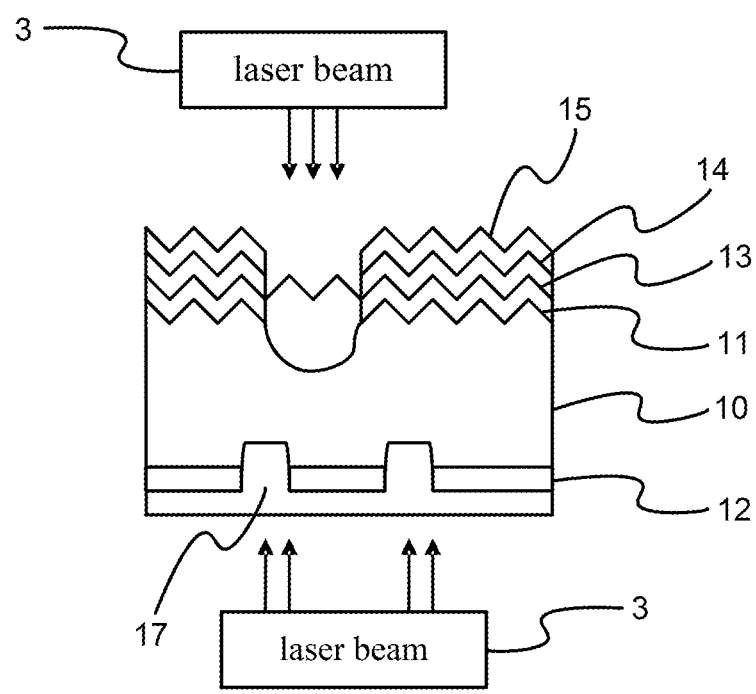
FIG. 7 is a schematic view of Step 7 of a process of manufacturing a crystalline silicon solar cell according to the invention.
Figure 8:
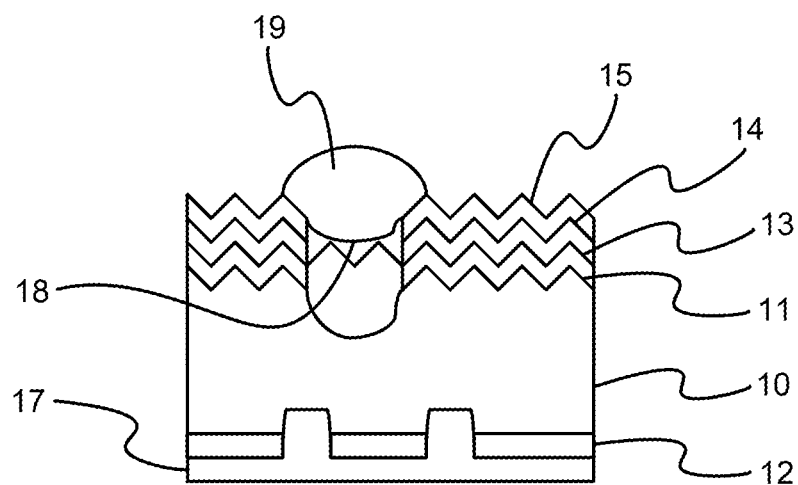
FIG. 8 is a schematic view of Step 8 of a process of manufacturing a crystalline silicon solar cell according to the invention.
Figure 9:
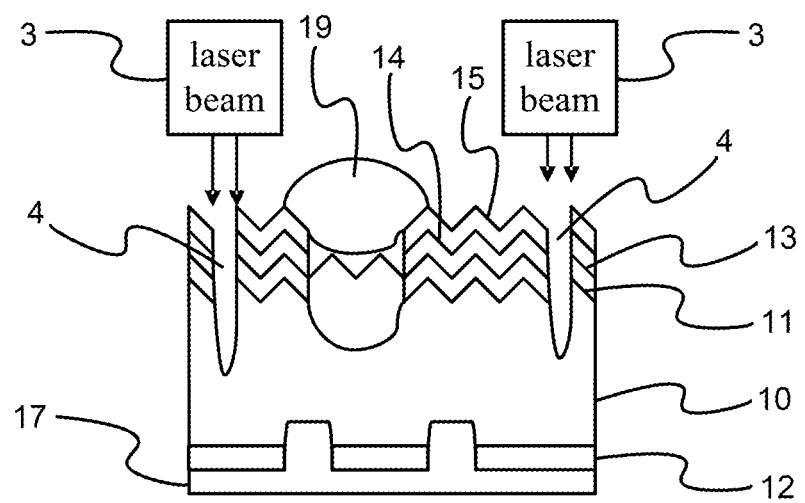
FIG. 9 is a schematic view of Step 9 of a process of manufacturing a crystalline silicon solar cell according to the invention.

FIG. 1 is a schematic view of Step 1 of a process of manufacturing a crystalline silicon solar cell according to the invention. FIG. 2 is a schematic view of Step 2 of a process of manufacturing a crystalline silicon solar cell according to the invention. FIG. 3 is a schematic view of Step 3 of a process of manufacturing a crystalline silicon solar cell according to the invention. FIG. 4 is a schematic view of Step 4 of a process of manufacturing a crystalline silicon solar cell according to the invention. FIG. 5 is a schematic view of Step 5 of a process of manufacturing a crystalline silicon solar cell according to the invention. FIG. 6 is a schematic view of Step 6 of a process of manufacturing a crystalline silicon solar cell according to the invention. FIG. 7 is a schematic view of Step 7 of a process of manufacturing a crystalline silicon solar cell according to the invention. FIG. 8 is a schematic view of Step 8 of a process of manufacturing a crystalline silicon solar cell according to the invention. FIG. 9 is a schematic view of Step 9 of a process of manufacturing a crystalline silicon solar cell according to the invention. As shown, this invention provides a process of manufacturing a crystalline silicon solar cell including at least the following steps:

Step 1: Take a crystalline silicon wafer 10 (a p-type crystalline silicon wafer is exemplified for illustration in embodiments of the present invention). A wet-chemical method is used to remove any mechanical damages on a surface of the crystalline silicon wafer 10, and then the wafer is subject to clean (as shown in FIG. 1).

Step 2: Form a rough surface 11 on the surface of the crystalline silicon wafer 10 by using a plasma device (as shown in FIG. 2).

Step 3: On a non-rough surface of the crystalline silicon wafer 10 coat an Al₂O₃ film 12 (as shown in FIG. 3). Then place the wafer 10 into a high-temperature phosphorus diffusion furnace for phosphorus diffusion. The Al₂O₃ film 12 can be used as an incident light internal reflective layer during the back surface chemical and electric field passivation to prevent the formation of any non-back surface phosphorus diffusion layers in phosphorus diffusion.

Step 4: Form a single-sided n diffusion layer 13 on the rough surface of the crystalline silicon wafer 10 by using the phosphorus diffusion process. A phosphosilicate glass (PSG) film 14 is formed on a top surface of the single-sided n diffusion layer 13 (as shown in FIG. 4).

Step 5: Coat an anti-reflection layer SiNx film 15 directly on a top surface of the PSG film 14 (as shown in FIG. 5).

Step 6: Coat an Al metallic film 16 as a back ohmic electrode on one side of the Al₂O₃ film 12 (shown in FIG. 6).

Step 7: Based on the computerized patterns, irradiate a laser beam 3 of ultraviolet laser, green laser, or infrared light laser directly onto the anti-reflection layer SiNx film 15 and the PSG film 14 for the melting and removal of a local area. On the one hand, phosphorus atoms in the PSG film 14 are diffused into the n diffusion layer 13 to form a local area n+—Si layer, while the local area of the anti-reflection layer SiNx film 15 and the PSG film 14 is eradicated by using the laser, completely retaining the area where is not exposed to the laser. In accordance with the computerized patterns, the laser beam 3 is directly irradiated on the Al₂O₃ film 12 and the Al metallic film 16 for local area melting and removal so that an Al—Si back ohmic contact electrode 17 is formed between the Al metallic film 16 and the crystalline silicon wafer 10. The laser beam eradicates the irradiated area of the Al₂O₃ film 12, while completely retaining the area where is not irradiated by the laser (as shown in FIG. 7).

Step 8: Form a mask pattern between the local area of the anti-reflection layer SiNx film 15 and the PSG film 14 at Step 7 and the non-irradiated area of the antireflection layer SiNx film 15 and the PSG film 14. A Ni film 18 is formed on the molten area and removed area of the antireflection layer SiNx film 15 and the PSG film 14 by light-induced plating. Then a front ohmic contact electrode 19 of copper material is electroplated on the Ni film 18 to form a solar cell component 1. The solar cell component 1 includes, from top to bottom, respectively, the anti-reflection layer SiNx film 15, the PSG film 14, the n diffusion layer 13, the crystalline silicon wafer 10, the Al₂O₃ film 12 and the back ohmic contact electrode 17.

The front ohmic electrode 19 is located between the anti-reflection layer SiNx film 15 and the PSG film 14 (as shown in FIG. 8). The Ni thin film 18 at this Step has another important function of acting as a Cu atom diffusion barrier. It is proved that Cu atoms will damage the photoelectric conversion efficiency of crystalline silicon solar cells. Therefore, the copper film is thickened by electroplating and then used as the front ohmic contact electrode 19 so as to reduce material costs and lower the impedance of the front ohmic contact electrode 19 and the resistance of the solar cells in series.

Step 9: Form spacers 4, as peripheral electrical isolation, on the anti-reflection layer SiNx film 15, the PSG film 14, the n diffusion layer 13 and the crystalline silicon wafer 10 of the solar component 1 by irradiating the UV laser, green laser, or infrared light laser. The spacers 4 prevent the back ohmic contact electrode 17 from mutually electrical contact with the front ohmic contact electrode 19.

Therefore, no wet chemical process is used in the above steps of the present invention, except the Step 1 in which the crystalline silicon wafer 10 is subject to mechanical damage removal and cleansing. The use of a number of advanced processing technologies makes the process of manufacturing the crystalline silicon solar cell provided by the present invention more environmentally friendly and progressive with enhanced efficiency for the solar cells. Additionally, this invention can reach at least the following advantages:

1. No need of any chemical or plasma removal process on the back surface phosphorus diffusion thin layer, which usually requires in a conventional phosphorus diffusion process. Therefore, the process of manufacturing the crystalline silicon solar cells becomes easier.

Make full use of the phosphosilicate glass thin layer which the conventional process must remove as a phosphorus atom source for an $n^+$-emitter in secondary phosphorus diffusion so that the chemical removal process of the phosphosilicate glass thin layer and the provision of phosphorus atom source for an $n^+$-emitter in secondary phosphorus diffusion are not required any more. Therefore, this novel process of manufacturing p-type crystalline silicon solar cell is an environmentally friendly and gains more benefits due to enhanced photoelectric conversion efficiency of the crystalline silicon solar cells.

In addition, this invention can be applied not only to the p-type crystalline silicon wafer but also to a boron diffusion process in the process of manufacturing n-type crystalline silicon solar cells. Similarly, the use of other high-dielectric thin-film materials, such as SiNx film, prevents the back surface boron atom diffusion layer from being formed, without the need of any chemical etching remove process that requires in to remove borosilicate glass films produced in the conventional boron diffusion process.

In summary, the process of manufacturing the crystalline silicon solar cell can effectively improve the shortcomings in the prior art, without adding processing steps to the existing standard process of manufacturing the crystalline silicon solar cell. This invention not only offers the simplified chemical process with minimal problems about dealing with follow-up chemical solutions, but also achieves the improvement on the photoelectric conversion efficiency of the crystalline silicon solar cells. This makes the invention more progressive and more practical in use which complies with the patent law.

The descriptions illustrated supra set forth simply the preferred embodiments of the present invention; however, the characteristics of the present invention are by no means restricted thereto. All changes, alternations, or modifications conveniently considered by those skilled in the art are deemed to be encompassed within the scope of the present invention delineated by the following claims.

What is claimed is:

1. A process of manufacturing a crystalline silicon solar cell, comprising at least the following steps:
    Step 1: taking a crystalline silicon wafer, in which a wet-chemical process is used to remove any mechanical damages on a surface of the crystalline silicon wafer, and then the wafer is subject to clean;
    Step 2: forming a rough surface on the surface of the crystalline silicon wafer by using a plasma device;
    Step 3: coating an $Al_2O_3$ film on a non-rough surface of the crystalline silicon wafer, and then placing the wafer into a high-temperature phosphorus diffusion furnace for phosphorus diffusion;
    Step 4: forming a single-sided n diffusion layer on the rough surface of the crystalline silicon wafer by using the phosphorus diffusion process; and forming a phosphosilicate glass (PSG) film on a top surface of the single-sided n diffusion layer;
    Step 5: coating an anti-reflection layer SiNx film directly on a top surface of the PSG film;
    Step 6: coating an Al metallic film as a back ohmic electrode on one side of the $Al_2O_3$ film;
    Step 7: irradiating a laser beam directly onto the anti-reflection layer SiNx film and the PSG film for the melting and removal of a local area, diffusing phosphorus atoms of the PSG film into the n diffusion layer to form a local area of n+—Si layer, and then directly irradiating the $Al_2O_3$ film and the Al metallic film with a laser beam for local area melting and removal so that an Al—Si back ohmic contact electrode is formed between the Al metallic film and the crystalline silicon wafer;
    Step 8: forming a Ni film on the molten and removed area of the antireflection layer SiNx film and the PSG film by light-induced plating, and then electroplating a front ohmic contact electrode of copper material on the Ni film to form a solar cell component; and
    Step 9: form spacers, as peripheral electrical isolation, on the anti-reflection layer SiNx film, the PSG film, the n diffusion layer and the crystalline silicon wafer of the solar cell component by irradiating the laser beam.

2. The process of manufacturing a crystalline silicon solar cell of claim 1, wherein the crystalline silicon wafer is a p-type crystalline silicon wafer.

3. The process of manufacturing a crystalline silicon solar cell of claim 1, wherein the solar cell component comprises, from top to bottom, the anti-reflection layer SiNx film, the PSG film, the n diffusion layer, the crystalline silicon wafer, the $Al_2O_3$ film and the back ohmic contact electrode, and the front ohmic electrode is located between the anti-reflection layer SiNx film and the PSG film.

4. The process of manufacturing a crystalline silicon solar cell of claim 1, wherein at Step 7, according to computerized patterns, the laser beam is directly irradiated on the anti-reflection layer SiNx film and the PSG film for melting the local area, while diffusing phosphorus atoms of the PSG film into the n diffusion layer to form a local area of n+—Si layer, and then eradicating the local area of the anti-reflection layer SiNx film and the PSG film by using the laser, completely retaining the area where is not exposed to the laser beam.

5. The process of manufacturing a crystalline silicon solar cell of claim 1, wherein at Step 7, according to the computerized patterns, the laser beam is irradiated on the $Al_2O_3$ film and the Al metallic film for local area melting and removal so that an Al—Si back ohmic contact electrode is formed with the irradiated area of the $Al_2O_3$ film being eradicated by the laser beam while the non-irradiated area being completely retained.

6. The process of manufacturing a crystalline silicon solar cell of claim 1, wherein the laser beam used at Step 7 and Step 9 is ultraviolet laser, green laser, or infrared light laser.

7. The process of manufacturing a crystalline silicon solar cell of claim 1, wherein at Step 8, according to the computerized patterns, a mask pattern is formed between the local area of the anti-reflection layer SiNx film and the PSG film and the non-irradiated area of the antireflection layer SiNx film and the PSG film.

* * * * *